(12) United States Patent
Kikushima

(10) Patent No.: US 6,806,797 B2
(45) Date of Patent: Oct. 19, 2004

(54) TUNING-FORK PIEZOELECTRIC RESONATOR ELEMENT, PRODUCTION METHOD THEREFOR, AND PIEZOELECTRIC DEVICE

(75) Inventor: Masayuki Kikushima, Ina (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/382,830

(22) Filed: Mar. 7, 2003

(65) Prior Publication Data

US 2004/0085163 A1 May 6, 2004

(30) Foreign Application Priority Data

Mar. 25, 2002 (JP) ........................................ 2002-084146
Mar. 25, 2002 (JP) ........................................ 2002-084152
Feb. 20, 2003 (JP) ........................................ 2003-043236

(51) Int. Cl.$^7$ .............................. H03H 9/21; H03H 3/02
(52) U.S. Cl. ...................... 333/200; 310/370; 29/25.35; 73/504.16
(58) Field of Search ................................ 333/200, 186; 310/370; 29/25.35; 73/504.16

(56) References Cited

U.S. PATENT DOCUMENTS

| 4,384,232 A | * | 5/1983 | Debely ........................ 310/370 |
| 6,587,009 B2 | * | 7/2003 | Kitamura et al. ........... 331/158 |

FOREIGN PATENT DOCUMENTS

| JP | A-55-138916 | 10/1980 |
| JP | A-56-65517 | 6/1981 |
| JP | A-7-55479 | 3/1995 |
| JP | A-10-170272 | 6/1998 |
| JP | 2000-223992 | * 8/2000 |
| WO | WO 00/44092 | 7/2000 |

* cited by examiner

Primary Examiner—Barbara Summons
(74) Attorney, Agent, or Firm—Oliff & Berridge, PLC

(57) ABSTRACT

In a tuning-fork piezoelectric resonator element, a quartz wafer is subjected to wet etching such that the lengthwise, widthwise, and thickness directions of resonating arms are oriented corresponding to the Y-axis, X-axis, and Z-axis of quartz crystal, lengthwise grooves are provided on principal surfaces of the resonating arms so that the center lines thereof are placed offset in the -X-direction from the center lines of the resonating arms, thereby balancing the stiffness between the right and left portions in the widthwise direction of the resonating arms, and stabilizing bending of the resonating arms. In a production process for the tuning-fork piezoelectric resonator element, the offset in the widthwise direction caused between the upper and lower principal surfaces of the resonating arms by the misalignment of photomasks is adjusted by shifting the relative positions of the grooves in the widthwise direction so that the centers of gravity of upper and lower portions of the widthwise cross section of the resonating arms divided into two equally in the thickness direction are aligned on the same line perpendicular to the principal surfaces. Consequently, the displacement in the thickness direction of the resonating arms during excitation is resolved or reduced, and loss of strain energy due to vibration leakage is prevented.

By reducing the CI value, high performance and high performance stability are achieved.

21 Claims, 9 Drawing Sheets

TUNING-FORK PIEZOELECTRIC RESONATOR ELEMENT, PRODUCTION METHOD THEREFOR, AND PIEZOELECTRIC DEVICE

BACKGROUND OF THE INVENTION

1. Field of Invention

The present invention relates to piezoelectric devices, such as piezoelectric resonators and piezoelectric oscillators for use in various electronic devices, and piezoelectric vibrating gyroscopes for use as angular speed sensors; More particularly, the invention relates to a tuning-fork piezoelectric resonator element used in those devices, and a production method of the tuning-fork piezoelectric resonator element.

2. Description of Related Art

In related art consumer and industrial electronic devices such as timepieces, household electrical appliances, various information and communication devices, and office automation devices, piezoelectric devices, such as a piezoelectric resonator, an oscillator and a real time clock module in which a piezoelectric resonator and an IC chip are sealed in the same package, can be used as a clock source of an electronic circuit. Furthermore, piezoelectric vibrating gyroscopes can be used as rotation angular speed sensors to control the attitude and navigation of ships, aircrafts, automobiles, and the like, and to prevent and detect the camera shaking of video cameras and the like, and can also be applied to rotating direction sensors, such as three-dimensional mice. Such a piezoelectric vibrating gyroscope is disclosed in, for example, Japanese Unexamined Patent Application Publication No. 7-55479 (JP 479), and Japanese Unexamined Patent Application Publication No. 10-170272 (JP 272).

In particular, with a reduction in the related art in size and thickness of electronic devices in which these piezoelectric devices are mounted, the piezoelectric devices are required to further reduce the size and thickness thereof. The piezoelectric devices are also required to ensure a low CI (crystal impedance) value and to achieve high quality and high stability. In order to keep the CI value low, for example, a tuning-fork piezoelectric resonator element provided with resonating arms each having a groove has been developed, for example, as disclosed in Japanese Unexamined Patent Application Publication No. 56-65517 (JP 517), and the specification of Japanese Patent Application No. 2000-595424 (JP 424).

In this tuning-fork piezoelectric resonator element provided with resonating arms each having a groove, upper and lower principal surfaces 3a and 3b of a pair of resonating arms 2a and 2b extending in parallel from a base portion 1 are provided with linear grooves 4a and 4b extending along the lengthwise direction thereof, as illustrated in FIG. 8. As shown in FIGS. 9(A) and 9(B), first electrodes 5a and 5b are formed on side faces and bottom faces of the grooves 4a and 4b, and second electrodes 6a and 6b are formed on side faces of the resonating arms 2a and 2b. The first electrodes 5a (5b) of one of the resonating arms are electrically connected to the second electrodes 6b (6a) of the other resonating arm, thereby constituting driving electrodes to vibrate the tuning-fork quartz resonator element. When an alternating voltage is applied from connecting terminals 7 to the driving electrodes, electric fields E1 and E2 parallel to the principal surfaces are produced between the first electrodes 5a and 5b and the second electrodes 6a and 6b adjoining each other, and as a result, field efficiency is substantially enhanced, and the CI value can be reduced.

Usually, by processing a wafer made of a piezoelectric single-crystal material, such as quartz crystal, by wet etching using photolithography to form a desired outline of the resonator element and the grooves 4a and 4b, electrode films are formed on the surfaces of the resonator element and the grooves 4a and 4b by patterning. More specifically, corrosion-resistant films are formed on both surfaces of a quartz wafer, and photoresists are applied thereon and are dried to form resist films. In a state in which a pair of upper and lower first photomasks having the same etching pattern corresponding to the desired outline of the resonator element are placed thereon, the surfaces of the corrosion-resistant films are exposed by exposure and development, and are removed with etchant to expose the surfaces of the quartz wafer. After the remaining resist films are stripped off, photoresists are applied again on the remaining corrosion-resistant films, and are dried to form new resist films. Then, a pair of upper and lower second photomasks having an etching pattern corresponding to the shape of the grooves of the resonating arms are placed thereon, and the surfaces of the corrosion-resistant films are exposed by exposure and development.

Subsequently, the exposed surfaces of the quartz wafer are etched with a quartz etchant, thereby forming the outline of the resonator element including the resonating arms. Furthermore, the exposed surfaces of the corrosion-resistant films are removed with etchant to expose the surfaces of the quartz wafer. By half-etching the exposed surfaces of the quartz wafer to a predetermined depth with a quartz etchant, grooves are formed on the upper and lower principal surfaces of the resonating arms. An electrode material is deposited on all the surfaces of the quartz element thus formed, including the inner faces of the grooves of the resonator element, by evaporation, sputtering, and the like, and is polarized by photoetching, thereby forming desired driving electrodes, extraction electrodes, and lines.

For example, the used quartz wafer is formed by cutting out quartz crystal around the X-axis at a cutting angle θ ranging, for example, from approximately 30 minutes to 2 degrees from the Z-axis. As shown in FIG. 8, the lengthwise, widthwise, thickness directions of the resonating arms 2a and 2b of the tuning-fork piezoelectric resonator element are oriented corresponding to the Y-axis called a mechanical axis of the quartz crystal structure, the X-axis called an electric axis, and the Z-axis called an optical axis, respectively. Therefore, the widthwise direction of the resonating arms 2a and 2b coincides with the X-axis direction, the lengthwise direction corresponds to the Y'-direction inclined at the angle θ to the Y-axis direction, and the thickness direction corresponds to the Z'-direction inclined at the angle θ to the Z-axis direction.

SUMMARY OF THE INVENTION

As shown in FIG. 9(A), the grooves 4a (4b) of the resonating arm 2a (2b) are placed so that a center line C1 thereof coincides with a center line C2 of the resonating arm. However, since most piezoelectric resonator elements are made of a piezoelectric single-crystal material having etching anisotropy, such as quartz crystal, the cross-sections of the resonating arm and the grooves formed by wet etching are often asymmetrical with respect to the center lines C1 and C2 because of the crystal orientation. In particular, the etching rate of the quartz crystal has a crystal-axis dependence, and the quartz crystal is prone to be etched in widthwise direction of the resonating arm, that is, in the +X direction in the example shown in FIG. 8. Therefore, the cross-sections of the grooves 4a (4b) are not shaped like an ideal rectangle that is shown by imaginary lines 8 in FIG. 9(B), but are asymmetrical, that is, the left side faces thereof are inclined rightward in the figure, and a projection 9 is formed on the right side face of the resonating arm 2a (2b).

For this reason, a non-negligible difference in stiffness is formed between the right and left sides of the center line C2 of the resonating arm, and bending of the resonating arm is unbalanced between the right and left sides, that is, inside and outside of the tuning fork during excitation. Consequently, vibrations are not confined in the resonating arm, but leak from a mount portion of the piezoelectric resonator element toward the package, which may cause a loss of strain energy. When the amount of unbalance in bending between the right and left sides of the resonating arm increases and the loss of strain energy of the piezoelectric resonator element increases, the natural frequency, that is, the oscillation frequency decreases, and the natural frequency varies widely.

In a case in which the first photomasks are incorrectly aligned on the upper and lower surfaces of the quartz wafer during the above process of forming the outline of the piezoelectric resonator element, the upper principal surface 3a and the lower principal surface 3b of the resonating arm 2a (2b) are offset from each other in the widthwise direction, as shown by the center lines C1 and C2 in FIG. 10, and the cross-section of the resonating arm may be vertically asymmetrical in the thickness direction. In particular, when size reduction of the piezoelectric resonator element is furthered, since positioning of the photomasks becomes more difficult, and the positioning accuracy is decreased, the cross-section tends to be asymmetrical.

In an elastic member having such an asymmetrical cross-section, tensile force and compressive force produced by the inverse piezoelectric effect of the electric fields E1 and E2 act vertically in an unbalanced manner in the thickness direction (Z'-direction) of the cross-section taken along the widthwise direction perpendicular to the principal surfaces, that is, along the X-direction, as shown in FIG. 10. For this reason, the resonating arms 2a and 2b receive a moment that twists the entire resonating arms 2a and 2b in the thickness direction during excitation, and exhibit flexural vibration in the widthwise direction while being displaced in the thickness direction. As a result, vibrations may leak to lose strain energy, and vibration characteristics may be unstable. When the loss of the strain energy is increased, the natural frequency, that is, the oscillation frequency of the piezoelectric resonator element decreases, and the natural frequency varies widely.

The present invention addresses or solves the above and/or other problems, and provides a tuning-fork piezoelectric resonator element which is made of a piezoelectric material having etching anisotropy, which has resonating arms each having a groove, and in which stable bending motion is ensured by achieving a good balance of stiffness between the right and left sides of the resonating arms in the widthwise direction or enhancing the balance, and high stability is achieved in addition to enhancement of performance by reducing the C1 value.

The present invention also provides a tuning-fork piezoelectric resonator element having grooved resonating arms in which, performance is enhanced by reducing the C1 value, the displacement in the thickness direction of bending vibration of the resonating arms caused by the offset between the upper and lower principal surfaces of the resonating arms is effectively resolved or reduced, the loss of strain energy due to vibration leakage is prevented or reduced, and stable vibration characteristics are ensured.

The present invention also provides a production method for such a tuning-fork piezoelectric resonator element.

The present invention also provides high-performance and high-stability piezoelectric device using such a tuning-fork piezoelectric resonator element.

In order to address or achieve the above, according to a first aspect of the present invention, there is provided a tuning-fork piezoelectric resonator element made of a piezoelectric material having etching anisotropy in a predetermined direction, and including a pair of resonating arms extending from a base portion, and a driving electrode including first electrodes provided on front and back principal surfaces of each of the resonating arms, and second electrodes provided on side faces of the resonating arm. One of the principal surfaces of the resonating arm is provided with a groove extending in the lengthwise direction of the resonating arm so that a center line of the groove is offset from a center line of the resonating arm in a direction opposite to the predetermined direction of the etching anisotropy. The first electrode provided on at least one of the principal surfaces is formed of an electrode film formed on a side face of the groove.

When the outline of the tuning-fork piezoelectric resonator element and the grooves of the resonating arms are formed by subjecting a piezoelectric material having etching anisotropy to a related art wet etching method, as described above, there is a danger that the cross-section will be asymmetrical in the widthwise direction and that the stiffness of each resonating arm will increase from its center line in the direction opposite to the predetermined direction of the etching anisotropy. By arranging the groove of the resonating arm, as in the present invention, the unbalance of the stiffness due to such an asymmetrical cross-section can be prevented or enhanced. Therefore, bending of the right and left sides of the resonating arm is stabilized, a loss of strain energy due to vibration leakage is prevented, and stable bending can be repeated.

Quartz crystal that has been adopted in the related art is preferable as the piezoelectric material. In this case, by placing the lengthwise, widthwise, and thickness directions of the resonating arm corresponding to the Y-axis, X-axis, and Z-axis directions, respectively, of the quartz crystal, and placing the groove offset from the center line of the resonating arm in the widthwise direction, that is, in the −X-direction of the quartz crystal, since the etching rate of the quartz crystal is high in the +X-direction, a good balance of stiffness can be ensured between the right and left sides of the resonating arm, in spite of the asymmetrical cross-sectional shape.

In an exemplary embodiment, it is confirmed that, when the offset amount of the center line of the groove from the center line of the resonating arm is within the range of 1% to 5% of the width of the resonating arm, more preferably, within the range of 2% to 4%, the oscillation frequency of the tuning-fork quartz resonator element can be increased, and does not widely vary even when the position of the groove is shifted in the widthwise direction of the resonating arm within the range of manufacturing errors.

According to a second aspect of the present invention, there is provided a tuning-fork piezoelectric resonator element including a pair of resonating arms extending from a base portion, grooves extending on upper and lower principal surfaces of each of the resonating arms in the lengthwise direction, and driving electrodes composed of a first electrode provided on a side face of each of the grooves and a second electrode provided on a side face of each of the resonating arms. One of the grooves is offset from the other groove in the widthwise direction of the resonating arm in the same direction as the direction in which the principal surface having the one of the grooves is offset from the principal surface having the other groove. The centers of gravity of two upper and lower portions of the widthwise cross-section of the resonating arm divided into two equally in the thickness direction are aligned with the same line perpendicular to the principal surfaces. In this case, it is also preferable that the piezoelectric material be quartz crystal that is adopted in the related art, and that the lengthwise, widthwise, and thickness directions of the resonating arm are oriented corresponding to the Y-axis, X-axis, and Z-axis directions of the quartz crystal.

In this configuration, even when the upper and lower principal surfaces of the resonating arm are offset from each other in the widthwise direction, a moment due to the unbalance of tensile force and compressive force in the two upper and lower sections of the entire cross-section of the resonating arm divided into two equally in the thickness direction is cancelled, and the displacement in the thickness direction during excitation can be overcome or reduced. Therefore, the loss of strain energy due to vibration leakage is prevented, and the resonating arm can stably repeat flexural vibration.

In another exemplary embodiment, the tuning-fork piezoelectric resonator element may further include another pair of resonating arms extending from the base portion in a direction opposite to the above pair of resonating arms, and may be used in the piezoelectric vibrating gyroscope disclosed in JP 479 and JP 272 described above.

According to another aspect of the present invention, there is provided a piezoelectric device including the above-described tuning-fork piezoelectric resonator element of the present invention, and a package in which the tuning-fork piezoelectric resonator element is fixed at the base portion and is sealed. Furthermore, the present invention provides a piezoelectric device further including an IC element mounted in the package.

According to a further aspect of the present invention, there is provided a production method of a tuning-fork piezoelectric resonator element, the method including: of processing a wafer made of a piezoelectric material having etching anisotropy in a predetermined direction to form the outline of a tuning-fork piezoelectric resonator element including a base portion and a pair of resonating arms extending from the base portion, wet-etching at least one of front and back principal surfaces of each of the resonating arms to form a groove extending in the lengthwise direction of the resonating arm so that a center line of the groove is offset in the widthwise direction from a center line of the resonating arm in a direction opposite to the predetermined direction of the etching anisotropy, and forming a driving electrode by forming and patterning an electrode film on the principal surfaces and side faces of the resonating arm and on an inner face of the groove.

This makes it possible to produce, according to the related art processes, a tuning-fork piezoelectric resonator element in which the unbalance of stiffness due to the asymmetrical cross-sectional shape of the resonating arm with the groove is prevented or reduced, bending on the right and left sides of the resonating arm is stabilized, strain energy is prevented from being lost by vibration leakage, and stable bending can be repeated.

In an exemplary embodiment, quartz crystal that is used in the related art may be used as the piezoelectric material. In this case, when the lengthwise, widthwise, and thickness directions of the resonating arm are oriented corresponding to the Y-axis, X-axis, and Z-axis directions, respectively, of the quartz crystal, and the groove is offset from the center line of the resonating arm in the widthwise direction, that is, in the −X-direction of the quartz crystal, since the etching rate of the quartz crystal is high in the +X-direction, a good balance of stiffness can be ensured between the right and left sides of the asymmetrical cross-section of the resonating arm.

In another exemplary embodiment, it is preferable that the offset amount of the center line of the groove from the center line of the resonating arm be set within the range of 1% to 5% of the width of the resonating arm, more preferably, within the range of 2% to 4%, because the oscillation frequency of the tuning-fork quartz resonator element can be increased, and hardly varies even when the position of the groove is shifted in the widthwise direction of the resonating arm within the range of manufacturing errors.

According to a further aspect of the present invention, there is provided a production method of a tuning-fork piezoelectric resonator element, the method including: processing a wafer made of a piezoelectric material to form the outline of a tuning-fork piezoelectric resonator element including a base portion and a pair of resonating arms extending from the base portion, forming, on upper and lower principal surfaces of each of the resonating arms, grooves extending in the lengthwise direction of the resonating arm by photoetching, and forming and patterning an electrode film on the principal surfaces and side faces of the resonator element and on inner faces of the grooves. Corresponding to the offset of one of the principal surfaces from the other principal surface in the widthwise direction of the resonating arm caused in the processing step of forming the outline of the resonator element, one of the grooves to be formed on the one principal surface is offset from the other groove to be formed on the other principal surface in the same direction as the direction of the offset between the principal surfaces during the step of forming the grooves by photoetching. The centers of gravity of upper and lower portions of the widthwise cross-section of the resonating arm divided into two equally in the thickness direction are aligned on the same line perpendicular to the principal surfaces. In this case, it is also preferable that quartz crystal that is adopted in the related art be used as the piezoelectric material, and that the lengthwise, widthwise, and thickness directions of the resonating arms are oriented corresponding to the Y-axis, X-axis, and Z-axis direction of the quartz crystal.

By adding the step of adjusting the position of the groove formed on one of the principal surfaces of the resonating arm to the production process of the tuning-fork piezoelectric resonator element, it is possible to quickly cope with the offset in the widthwise direction between the upper and lower principal surfaces of the resonating arm that may be caused when forming the outline of the resonating arm, and to prevent or reduce a resultant displacement in the thickness direction. For this reason, it is possible to produce a tuning-fork piezoelectric resonator element which prevents loss of strain energy due to vibration leakage and which exhibits stable vibration characteristics, according to the related art process.

In an exemplary embodiment, the positions of the grooves can be relatively easily adjusted by aligning one of the grooves with the widthwise center of the principal surface on which the one groove is to be formed and by positioning the other groove in conjunction with the one groove.

In the production method for the tuning-fork piezoelectric resonator element of the present invention, by performing the processing step so that the tuning-fork piezoelectric resonator element further includes another pair of resonating arms extending from the base portion in a direction opposite to the pair of resonating arms, a tuning-fork piezoelectric resonator element can be obtained which is suitable for use in the above-described piezoelectric vibrating gyroscope disclosed in JP 479 and JP 272 described above.

DETAILED DESCRIPTION OF PREFERRED EMBODIMENTS

Exemplary embodiments of the present invention are described in detail below with reference to the attached drawings.

Figure 1:
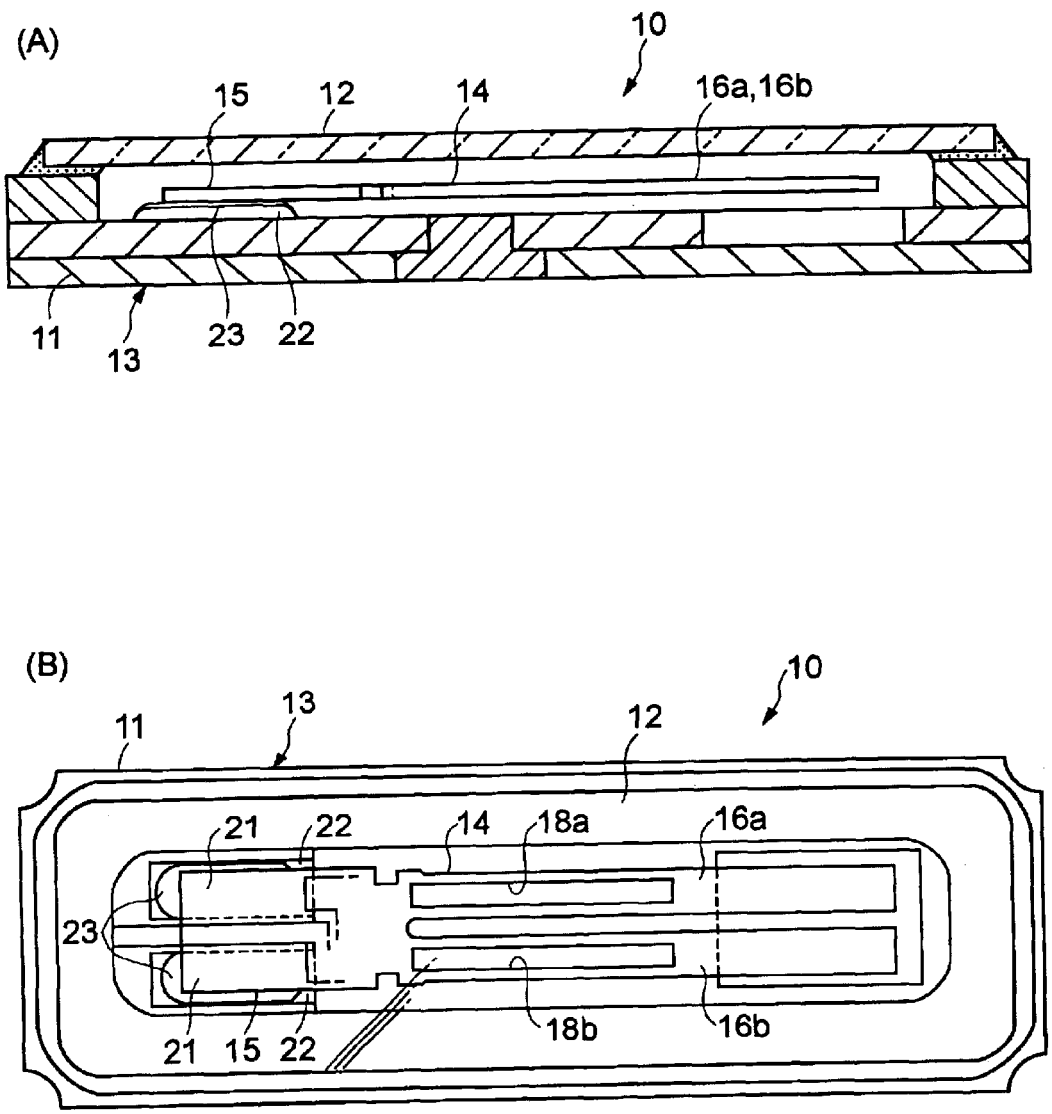
FIG. 1(A) is a longitudinal sectional view of a quartz resonator according to an exemplary embodiment of the present invention.
FIG. 1(B) is a plan view thereof.

FIGS. 1(A) and 1(B) schematically show a quartz resonator according to an exemplary embodiment to which the present invention is applied. A quartz resonator 10 has a package 13 including a base 11 and a cover 12 made of an insulating material, and a tuning-fork quartz resonator element 14 is hermetically sealed therein. The base 11 is shaped like a substantially rectangular box formed of a plurality of stacked ceramic thin plates, and the tuning-fork quartz resonator element 14 is mounted at the bottom of a cavity defined inside the box. The cover 12 is formed of a rectangular thin plate made of an insulating material, such as glass or ceramic, and is hermetically joined to an upper end face of the base 11 with low-melting glass. It is preferable that the cover 12 be made of transparent glass so that a laser beam can be applied from the outside of the package 13 in order to adjust the frequency.

The tuning-fork quartz resonator element 14 of the first exemplary embodiment has a structure disclosed in, for example, JP 517 described above, as shown in FIG. 2(A). Front and back principal surfaces 17a and 17b of a pair of resonating arms 16a and 16b extending in parallel from a base portion 15 are provided with linear grooves 18a and 18b along the lengthwise direction, respectively. First electrodes 19a and 19b formed of electrode films are deposited on side faces and bottom faces of the grooves 18a and 18b, and second electrodes 20a and 20b are provided on side faces of the resonating arms 16a and 16b. The first electrodes 19a (19b) of one of the resonating arms are electrically connected to the second electrodes 20b (20a) of the other resonating arm to constitute a driving electrode for vibrating the tuning-fork quartz resonator element 14. Extraction electrodes 21,21 from the driving electrode are provided in the base portion 15, and are fixed to corresponding connecting terminals 22,22 on the bottom surface of the base 11 with conductive adhesive 23, thereby substantially horizontally supporting the tuning-fork quartz resonator element 4 in a cantilevered manner.

Figure 2:
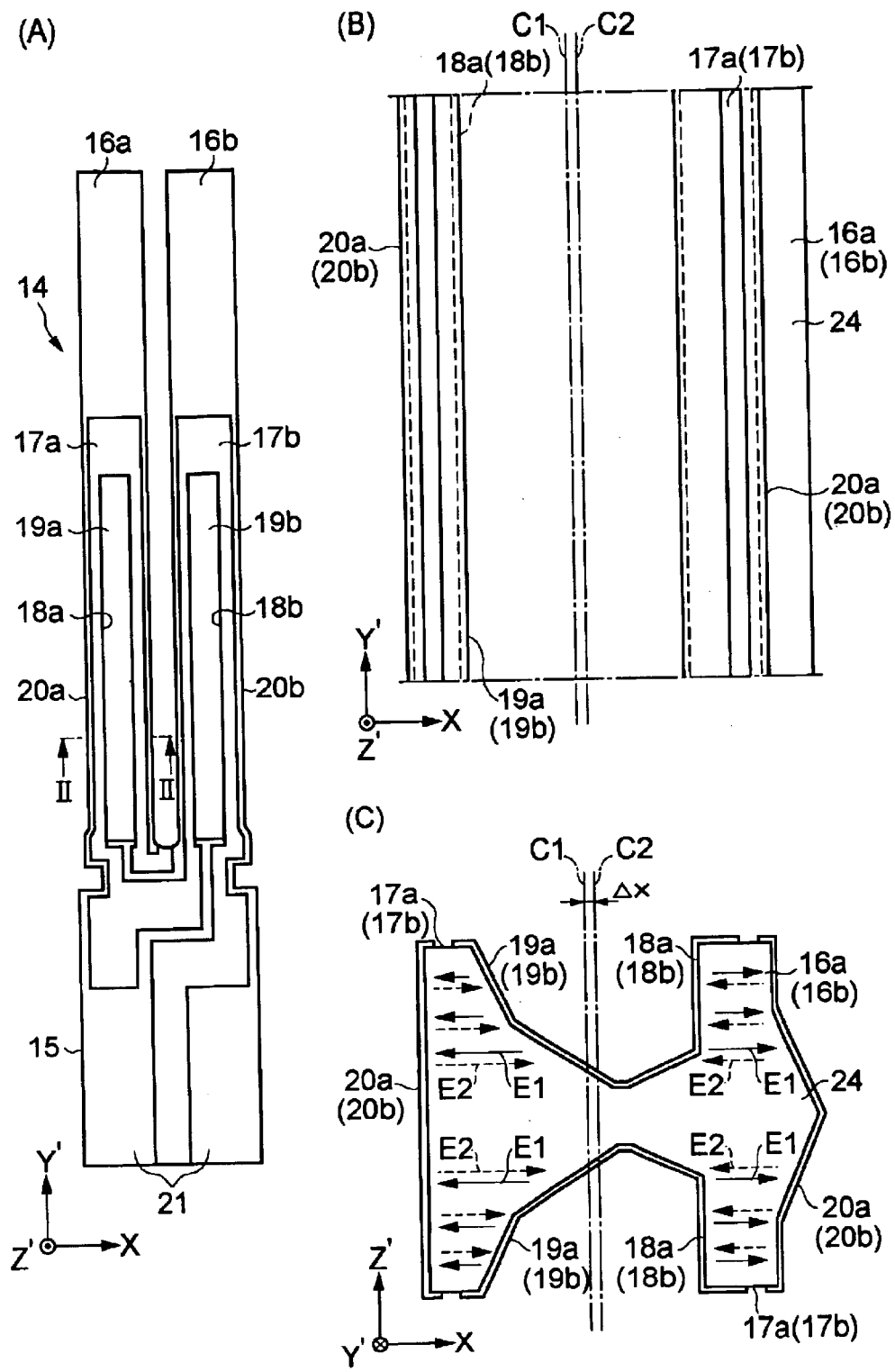
FIG. 2(A) is a plan view of a first exemplary embodiment of a tuning-fork quartz resonator element for use in the quartz resonator shown in FIGS. 1(A) and 1(B)
FIG. 2(B) is an enlarged partial plan view of a resonating arm therein.
FIG. 2(C) is a cross-sectional view, taken along plane II-II in FIG. 1(A)

A desired outline of the tuning-fork quartz resonator element 14 and the grooves 18a and 18b of the resonating arms 16a and 16b are formed by wet-etching a quartz wafer by photolithography, in a manner similar to that in the related art, and the driving electrodes, the extraction electrodes, and lines to connect the electrodes are formed by patterning an electrode film deposited thereon by sputtering or by other methods. When a predetermined alternating voltage is applied from the connecting terminals 22,22 to the driving electrodes, electric fields E1 and E2 are alternately produced between the first electrodes 19a and 19b and the second electrodes 20a and 20b adjoining each other, and the resonating arms 16a and 16b repeat bending in opposite directions. Since the electric fields E1 and E2 are parallel to the principal surfaces, as shown in FIG. 2(C), the field efficiency is substantially enhanced, and the C1 value can be reduced.

Figure 8:
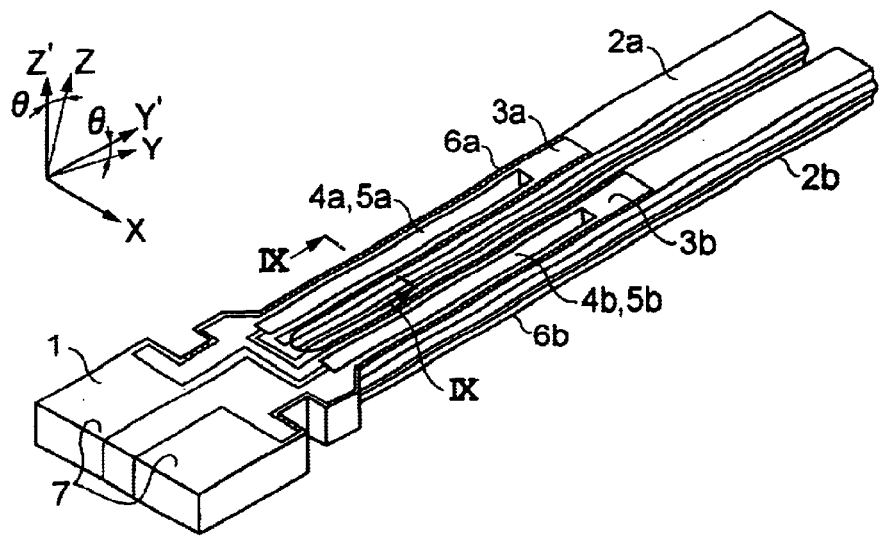
FIG. 8 is a plan view of a related art tuning-fork quartz resonator element.
Figure 9:
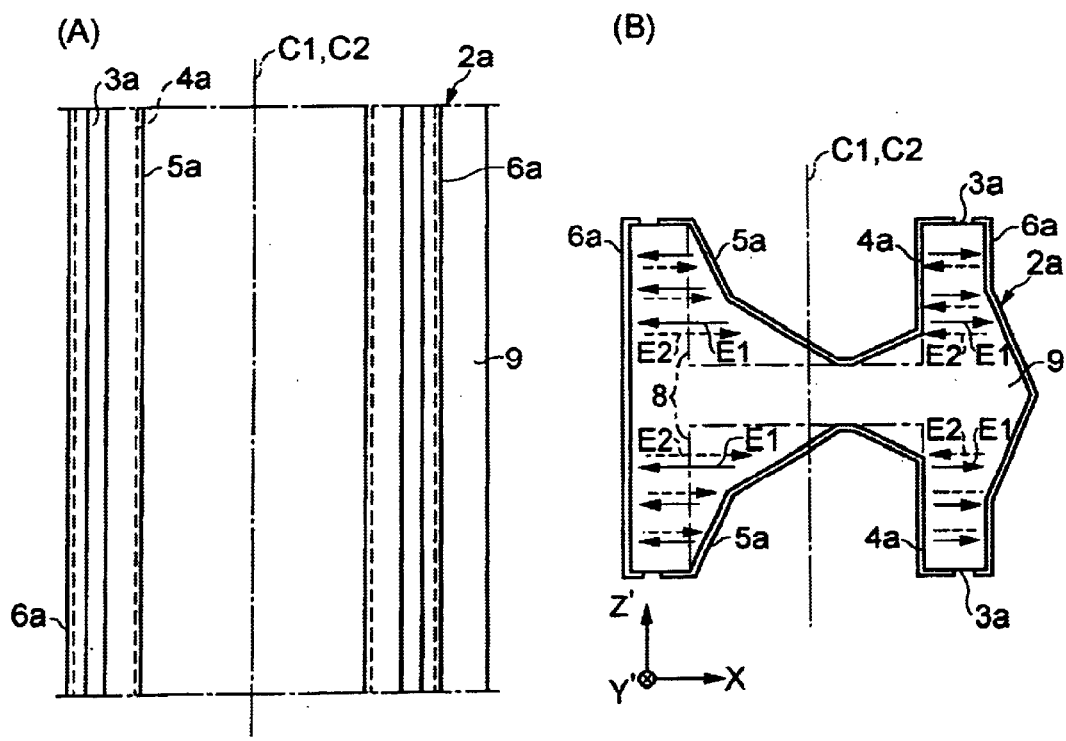
FIG. 9(A) is an enlarged partial plan view of a resonating arm shown in FIG. 8.
FIG. 9(B) is a cross-sectional view, taken along plane IX-IX in FIG. 9(A)
Figure 10:
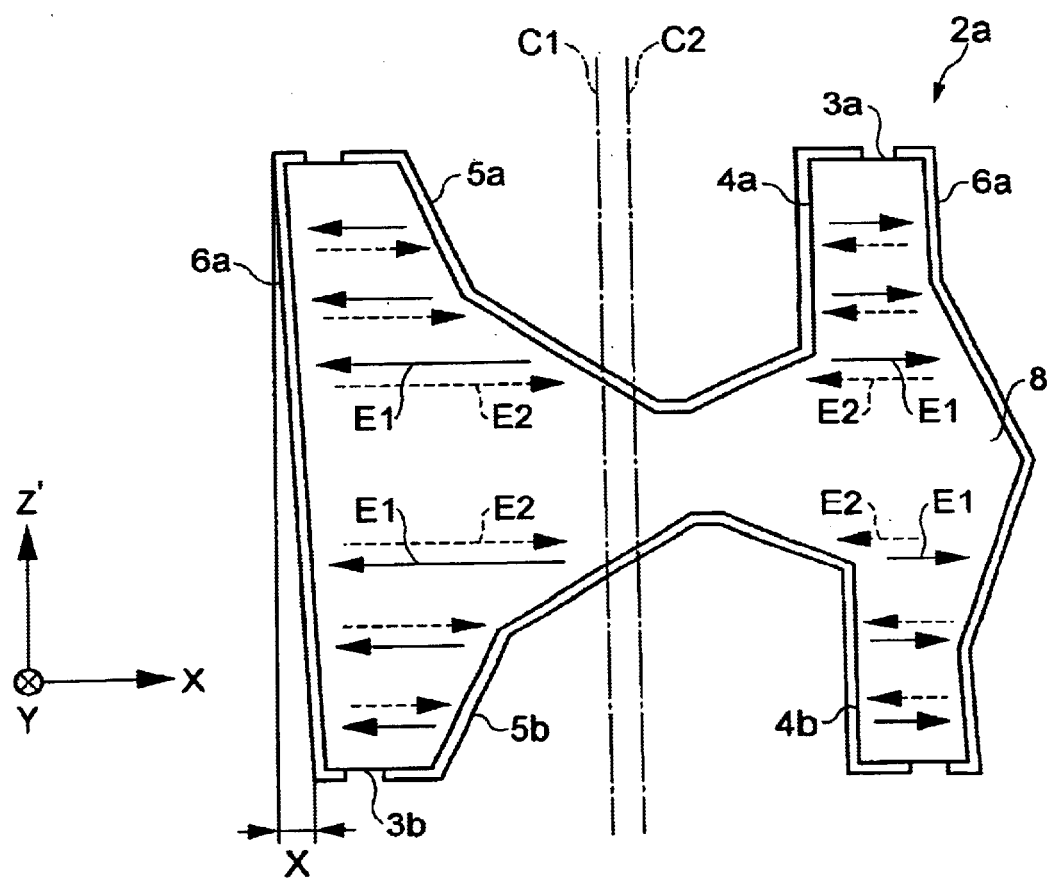
FIG. 10 is a cross-sectional view of a resonating arm of another related art tuning-fork quartz resonator element, similar to that in FIGS. 9(A) and 9(B).

When the tuning-fork quartz resonator element 14 is produced from the quartz wafer, the lengthwise, widthwise, and thickness directions of the resonating arms 16a and 16b are oriented corresponding to the Y-axis, X-axis, and Z-axis of the quartz crystal. This exemplary embodiment uses a quartz wafer that is formed by cutting quartz crystal around the X-axis by a predetermined cutting angle 0 ranging, for example, from approximately 30 minutes to 2 degrees from the Z-axis direction, as described above in conjunction with the related art shown in FIGS. 8 to 10. Therefore, the widthwise direction of the resonating arms 16a and 16b of this embodiment coincides with the X-axis direction of the crystal, the lengthwise direction coincides with the Y'-direction at the above angle e to the Y-axis direction, and the thickness direction coincides with the Z'-direction at the above angle θ to the Z-axis direction.

The etching rate of crystal has a dependence on the crystal axis. In this exemplary embodiment, since the resonating arms 16a and 16b are easily etched in the widthwise direction, that is, in the +X-direction, the resonating arms 16a and 16b and the grooves 18a and 18b are asymmetric in cross-section with respect to a center line C2 of the resonating arms 16a and 16b. As shown in FIG. 2(C), the side faces of the grooves 18a and 18b are inclined in the +X direction, and a projection 24 is formed on a side face in the +X-direction of the resonating arm 16a (16b). In this exemplary embodiment, the center line C1 of the grooves 18a (18b) is placed offset in the -X-direction from the center line C2 of the resonating arm 16a (16b).

The offset amount Δx is determined so that it is sufficiently larger than errors that may be usually made when the grooves are formed on the principal surfaces of the resonating arms by photolithography, and so that the stiffness of the resonating arms 16a (16b) is substantially balanced on the right and left sides of the center line C2. This allows each of the resonating arms 16a and 16b to uniformly bend on the right and left sides, that is, inside and outside the tuning fork during excitation, and vibrations are effectively confined in the resonating arms. Therefore, strain energy will not be lost, and it is possible to prevent or reduce decreases and variations in the natural frequency, that is, the oscillation frequency.

Figure 3:
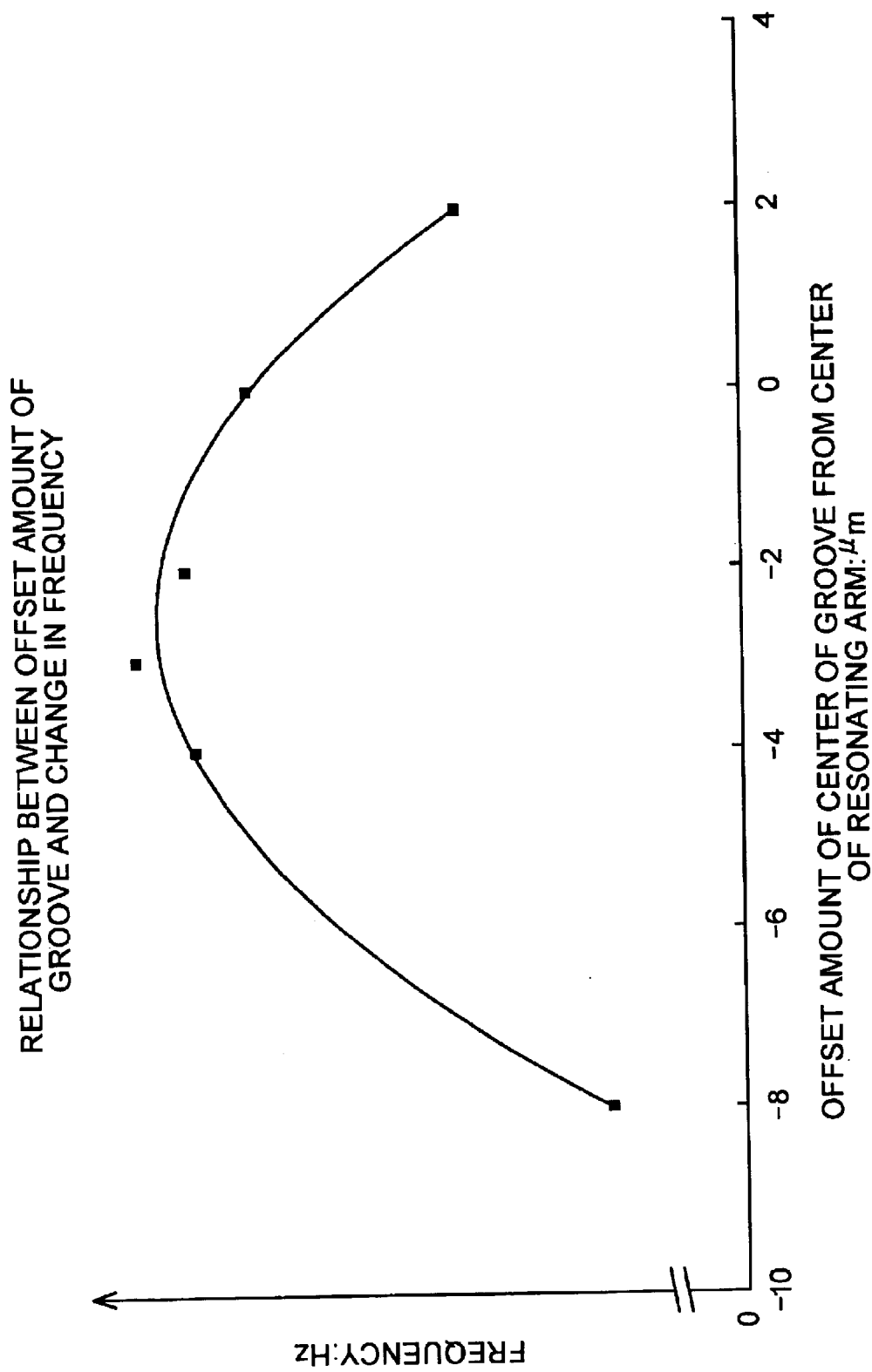
FIG. 3 is a graph showing changes in natural frequency (oscillation frequency) depending on the amount of offset between grooves of the resonating arm in the quartz resonator element shown in FIGS. 2(A)–2(C)

Tuning-fork quartz resonator elements similar to the tuning-fork quartz resonator element 14 shown in FIGS. 2(A)–2(C) were produced in which the width and thickness of the resonating arms 16a and 16b were set at 104 μm and 100 μm, the width and depth of the grooves 18a and 18b were set at 70 μm and 42 μm, and the grooves 18a and 18b were shifted by various offset amounts Ax in the +/−X-direction. The natural frequencies in these cases were calculated by a known FEM, and a result showing the changes in natural frequency depending on the offset amount of the grooves was obtained, as shown in FIG. 3.

It was confirmed from the figure that the natural frequency was the highest when the offset amount Δx was approximately −3 μm, and that the natural frequency gently changed even when the center position was shifted from the point in the +X- or −X-direction to a slight extent, for example, to an extent corresponding to an error that may be usually made when forming the grooves. As is also evident from the figure, in order to substantially prevent or reduce decreases and variations in the natural frequency, it is preferable that the offset amount Ax be set within the range of approximately −1 μm to −5 μm that allows the natural frequency to change relatively gently, that is, within the range of 1% to 5% of the width of the resonating arms in the -X-direction, in particular, within the range of approximately −2 μm to −4 μm, that is, within the range of 2% to 4% of the width of the resonating arms in the −X-direction. Consequently, the natural frequency can be easily adjusted during mass production of tuning-fork quartz resonator element 14.

Figure 4:
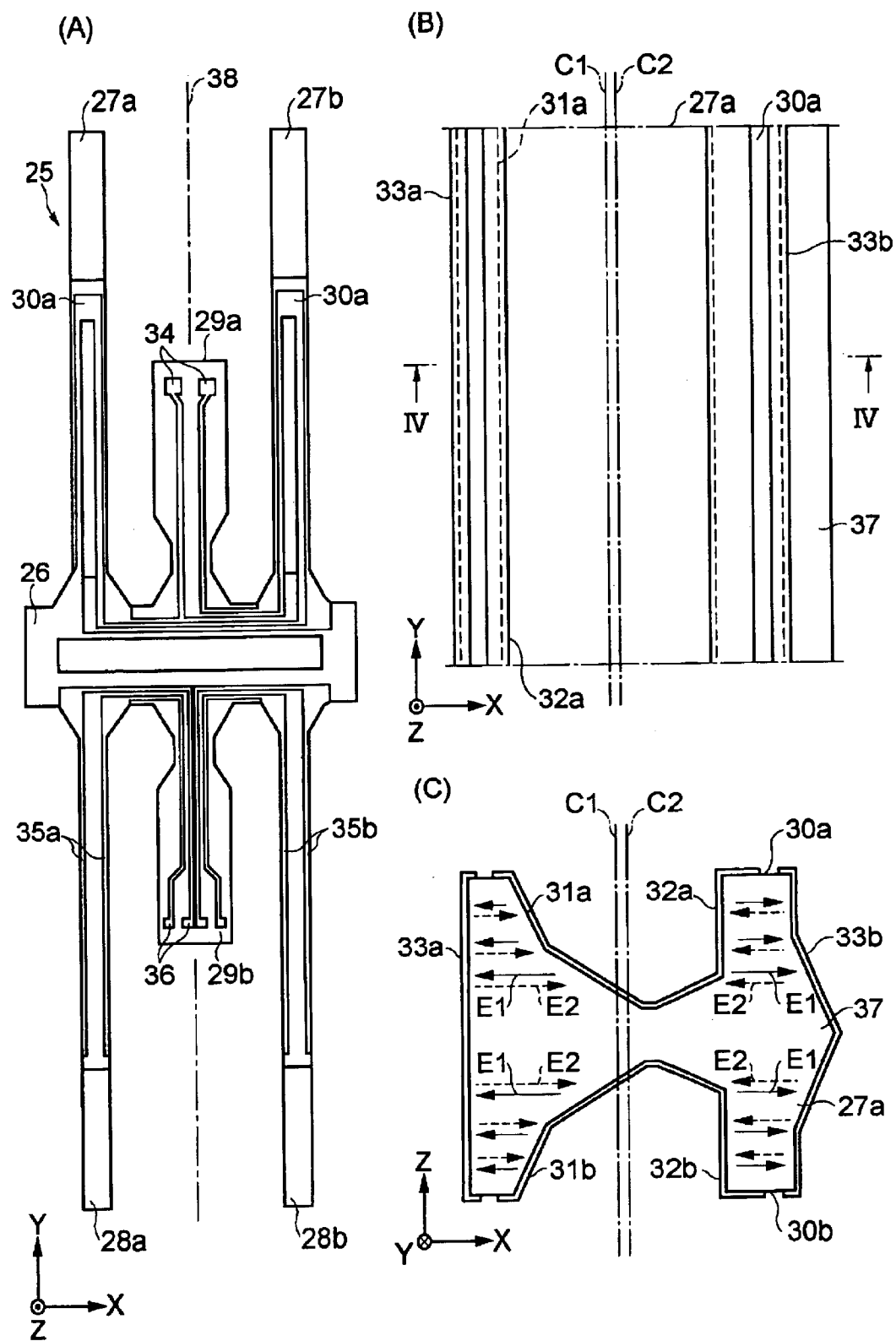
FIG. 4(A) is a plan view of a tuning-fork quartz resonator element for a piezoelectric vibrating gyroscope to which the first exemplary embodiment of the present invention shown in FIGS. 2(A)–2(C) is applied.
FIG. 4(B) is an enlarged partial plan view of a resonating arm for driving shown in FIG. 4(A)
FIG. 4(C) is a cross-sectional view, taken along plane IV-IV in FIG. 4(B)

FIGS. 4(A)–4(C) shows a tuning-fork quartz resonator element for use in a piezoelectric vibrating gyroscope according to the present invention. A tuning-fork quartz resonator element 25 includes a center base portion 26 having a cavity therein, a pair of resonating arms 27a and 27b extending from one side of the base portion 26, and a pair of detecting arms 28a and 28b extending from the other side of the base portion 26, for example, in a manner similar to that in the related art disclosed in Patent 2 described above. The base portion 26 is also provided with support portions 29a and 29b projecting between the resonating arms 27a and 27b and the detecting arms 28a and 28b, respectively. By fixedly bonding the support portions 29a and 29b, the tuning-fork quartz resonator element 25 is mounted inside a predetermined package (not shown) to constitute a piezoelectric vibrating gyroscope.

Front and back principal surfaces 30a and 30b of the resonating arms 27a and 27b are provided with linear grooves 31a and 31b formed along the lengthwise direction thereof, in a manner similar to that in the tuning-fork quartz resonator element 14 shown in FIGS. 2(A)–2(C). First electrodes 32a and 32b formed of electrode films for driving are deposited on side faces and bottom faces of the grooves 31a and 31b, and second electrodes 33a and 33b for driving are provided on side faces of the resonating arms 27a and 27b. The first driving electrode 32a (32b) of one of the resonating arms is electrically connected to the second driving electrode 33b (33a) of the other resonating arm to constitute a driving electrode to vibrate the tuning-fork quartz resonator element 25. Electrode pads 34 to drive are provided in one of the support portions 29a, and are electrically connected to the driving electrodes through wiring patterns. On the other hand, two pairs of detecting electrodes 35a and 25b are provided on side faces of the detecting arms 28a and 28b, and are electrically connected to detecting electrode pads 36 provided in the other support portion 29b through wiring patterns in a similar manner.

A desired outline of the tuning-fork quartz resonator element 25 and the grooves 31a and 31b of the resonating arms 27a and 27b are formed by wet-etching a quartz wafer by photolithography, in a manner similar to that in the tuning-fork quartz resonator element 14, and the electrodes, the electrode pads, and the wiring patterns for connecting the electrodes are formed by patterning an electrode film deposited thereon by sputtering or by other methods. This exemplary embodiment uses a quartz wafer that is cut out from crystal along a plane formed by the X-axis and the Y-axis, and the lengthwise, widthwise, and thickness directions of the resonating arms 27a and 27b are aligned with the Y-axis, X-axis, and Z-axis of the quartz crystal.

The resonating arms and the grooves are asymmetrical in cross-section with respect to the center line C2 of the resonating arms because of the crystal-axis dependence of the crystal etching rate. The side faces of the grooves 31a and 31b are inclined in the +X-direction, and a projection 37 is formed on a +X-direction side face of the resonating arm 27a (27b). In this exemplary embodiment, the grooves 31 and 31b are also placed so that the center line C1 thereof is offset in the −X-direction from the center line C2 of the resonating arm 27a (27b), as shown in FIG. 4(C). By appropriately setting the offset amount Δx to be sufficiently larger than errors that may be usually made when the grooves 31a and 31b are formed by photolithography, each of the resonating arms 27a and 27b uniformly bends on the right and left sides of the center line C2, and the stiffness thereof is substantially balanced on the right and left sides.

When a predetermined alternating voltage is applied to the driving electrodes through the driving electrode pads 34, electric fields E1 and E2 are alternately produced between the first electrodes 32a and 32b and the second electrodes 33a and 33b adjoining each other in a similar manner to the exemplary embodiment in FIGS. 2(A)–2(C), and the resonating arms 27a and 27b exhibit flexural vibration at the resonance frequency. Since the electric fields E1 and E2 are parallel to the principal surfaces, as shown in FIG. 4(C), the field efficiency is substantially increased, and the CI value can be reduced.

When the piezoelectric vibrating gyroscope, that is, the tuning-fork quartz resonator element 25 rotates on a Y-axis 38 in FIG. 4(A) in this state, the resonating arms 27a and 27b undergo stress in the Z-axis direction and vibrate in the Z-axis direction because of a Coriolis force that acts in the direction orthogonal to the vibrating direction in accordance with the angular speed of rotation ω. The vibrations are transmitted through the base portion 26 to vibrate the detecting arms 28a and 28b at their resonance frequency. Therefore, by detecting the vibrations as electrical signals from the detecting electrode pads 36, the angular speed of rotation, the rotating direction, and the like of the tuning-fork quartz resonator element 25 are found. In this exemplary embodiment, since bending of the resonating arms 27a and 27b is uniform on the right and left sides, and decreases and variations in the natural frequency can be prevented or reduced, it is possible to provide a higher-precision and higher-reliability piezoelectric vibrating gyroscope at a low cost.

FIGS. 5(A) and 5(B) schematically show a tuning-fork quartz resonator element 14 of a second exemplary embodiment for use in the quartz resonator of the present invention shown in FIGS. 1(A) and 1(B). As shown in FIG. 5(A), the tuning-fork quartz resonator element 14 has a structure substantially identical to that in the first exemplary embodiment shown in FIGS. 2(A)–2(C). Upper and lower principal surfaces 17a and 17b of resonating arms 16a and 16b are provided with linear grooves 18a and 18b formed along the lengthwise direction, respectively. First electrodes 19a and 19b are provided on side faces and bottom faces of the grooves 18a and 18b, and second electrodes 20a and 20b are provided on side faces of the resonating arms 16a and 16b, thereby constituting driving electrodes to vibrate the tuning-fork quartz resonator element 14.

In the tuning-fork quartz resonator element 14 of this exemplary embodiment, as well shown in FIG. 5(B), the upper and lower principal surfaces 17a and 17b of the resonating arms 16a and 16b are placed offset from each other by x1 in the widthwise direction, that is, in the +X-direction. One of the grooves 18a is placed so that a center line C1 thereof is aligned with the widthwise center of the corresponding upper principal surface 17a. The other groove 18b is placed so that a center line C2 is offset by x2 in the +X-direction from the widthwise center of the corresponding lower principal surface 17b. The offset amount x2 of the groove 18b is determined in accordance with the offset amount x1 between the principal surfaces so that the centers of gravity M1 and M2 of an upper portion and a lower portion obtained by dividing the widthwise cross-section of the resonating arm 16a (16b) shown in FIG. 5(B) into two in the thickness direction (Z'-direction) along a horizontal line H are aligned with the same line L perpendicular to the principal surfaces.

When the upper and lower principal surfaces 17a and 17b of the resonating arms are offset from each other in the widthwise direction in this way, there is an unbalance of tensile force and compressive force between the upper and lower sides in the thickness direction. In this exemplary embodiment, a moment due to such an unbalance of the tensile force and compressive force is cancelled by aligning the centers of gravity M1 and M2 in the entire cross-section of the resonating arm with the line L perpendicular to the principal surfaces. Therefore, displacement in the thickness direction of the resonating arm during excitation can be prevented or reduced. Consequently, in the resonating arm, loss of strain energy due to vibration leakage is prevented, decreases and variations in the natural frequency, that is, oscillation frequency can be prevented or reduced, and a stable flexural vibration can be ensured.

Since the tuning-fork quartz resonator element 14 also uses a quartz wafer that is formed by cutting quartz crystal around the X-axis by a cutting angle θ ranging, for example, from approximately 30 minutes to 2 degrees from the Z-axis, in a manner similar to that in the first exemplary embodiment shown in FIGS. 2(A)–2(C), the widthwise direction of the resonating arms 16a and 16b coincides with the X-axis direction of the crystal, the lengthwise direction coincides with the Y'-direction at the angle θ to the Y-axis direction, and the thickness direction coincides with the Z'-direction at the angle θ to the Z-axis direction. Since the resonating arms 16a and 16b are easily etched in the widthwise direction, that is, in the +X-direction because of the crystal-axis dependence of the crystal etching rate, the cross-sections of the resonating arms and the grooves are asymmetrical in the widthwise direction so that the side faces of the grooves 18a and 18b are inclined in the +X-direction and a projection 24 is formed on the +X-direction side face of the resonating arm 16a (16b), as shown in FIG. 5(B).

In the tuning-fork quartz resonator element 14, when a predetermined alternating voltage is applied from connecting terminals 22,22 to the driving electrodes, electric fields E1 and E2 are alternately produced between the first electrodes 19a and 19b and the second electrodes 20a and 20b adjoining each other, and the resonating arms 16a and 16b repeat bending in opposite directions. Since the electric fields E1 and E2 are parallel to the principal surfaces, as shown in FIG. 5(B), the field efficiency is substantially enhanced, and the CI can be reduced.

A desired outline of the tuning-fork quartz resonator element 14 and the grooves 18a and 18b of the resonating arms 16a and 16b are formed by wet-etching a quartz wafer by photolithography, in a manner similar to that in the related art, and the driving electrodes and so on are formed by patterning an electrode film deposited thereon. First, corrosion-resistant films, for example, Au films or Cr films are formed on both surfaces of the quartz wafer, and photoresists are applied thereon and are dried to form resist films. A pair of upper and lower first photomasks having the same etching pattern corresponding to the outline of the quartz resonator element 14 are placed thereon, and exposure and development are performed to expose the surfaces of the corrosion-resistant films. The corrosion-resistant films are then removed by etchant, and the surfaces of the quartz wafer are exposed. After the remaining resist films are stripped off, photoresists are applied again on the remaining corrosion-resistant films, and are dried to form new resist films. A pair of upper and lower second photomasks having an etching pattern corresponding to the shapes of the grooves 18a and 18b are placed thereon, and the surfaces of the corrosion-resistant films are exposed by performing exposure and development.

Next, the exposed surfaces of the quartz wafer are etched with an appropriate quartz etchant, such as fluorinated acid, to form the outline of the quartz resonator element 14 including the resonating arms 16a and 16b. Furthermore, the exposed surfaces of the corrosion-resistant films are removed by etchant to expose the surfaces of the quartz wafer. The exposed surfaces of the quartz wafer are then half-etched to a predetermined depth with a crystal etchant, so that the grooves 18a and 18b are formed on the upper and lower principal surfaces 17a and 17b of the resonating arms 16a and 16b.

The offset between the upper and lower principal surfaces of the resonating arms 16a and 16b caused in the widthwise direction, that is, in the +X-direction can be confirmed by the corrosion-resistant films that are left on both surfaces of the quartz wafer corresponding to the outline of the quartz resonator element 14 by etching using the first photomasks. Based on this result, the second photomasks are positioned so that the center line C1 of one of the grooves 18a is aligned with the widthwise center of the corresponding upper principal surface 17a and so that the center line C2 of the other groove 18b is offset by x2 in the +X-direction from the widthwise center of the corresponding lower principal surface 17b. Since the dimensions of the cross-section of the resonating arms 16a and 16b, such as the width and thickness of the resonating arms 16a and 16b and the width and depth of the grooves 18a and 18b, and the shape of the cross-section are known, an appropriate offset amount x2 of the groove 18b can be calculated beforehand from an expected offset amount x1 between the principal surfaces.

An electrode material is deposited on all the surfaces of the quartz element thus formed, including the inner faces of the grooves of the resonator, by evaporation, sputtering, and so on, thereby forming electrode films. Photoresists are applied thereon, and are dried to form resist films, a pair of upper and lower third photomasks having an etching pattern corresponding to desired electrodes and wiring patterns are placed thereon, and the surfaces of the electrode films are exposed by performing exposure and development. The exposed surfaces of the electrode films are etched to expose the surfaces of the quartz wafer for polarization, thereby forming desired driving electrodes, extraction electrodes, and lines.

Tuning-fork quartz resonator elements similar to the tuning-fork quartz resonator element 14 shown in FIGS. 5(A) and 5(B) were produced in which the width and thickness of the resonating arms 16a and 16b were set at 104 $\mu$m and 100 $\mu$m, the width and depth of the grooves 18a and 18b were set at 70 $\mu$m and 42 $\mu$m, the width (X-direction) and thickness (Z'-direction) of the projections 24 were set at 14 $\mu$m and 60 $\mu$m, the offset amount x1 in the +X direction between the principal surfaces was variously changed, and the position of the groove 18b of the lower principal surface 17b was correspondingly adjusted according to the present invention. For comparison, quartz resonator elements were produced in which the offset amount x1 between the principal surfaces was variously changed, and the groove 18b is placed at the widthwise center of the lower principal surface 17b without adjusting the position thereof, in a manner similar to that in the related art. The displacements in the thickness direction of the resonating arms of the resonator elements in both cases during excitation were calculated by known FEM, and a result shown in FIG. 6 was obtained.

The figure reveals that a displacement in the thickness direction substantially identical to that when the principal surfaces are not offset from each other is maintained even when the offset amount x1 between the principal surfaces increases in the tuning-fork quartz resonator element of the present invention. In contrast, it is shown that the displacement in the thickness direction is substantially increased depending on the offset between the principal surfaces in the comparative example having the related art structure. Therefore, it is confirmed that the present invention can prevent or reduce the displacement in the thickness direction of the resonating arms during excitation, and can achieve stable vibration characteristics.

Figure 7:
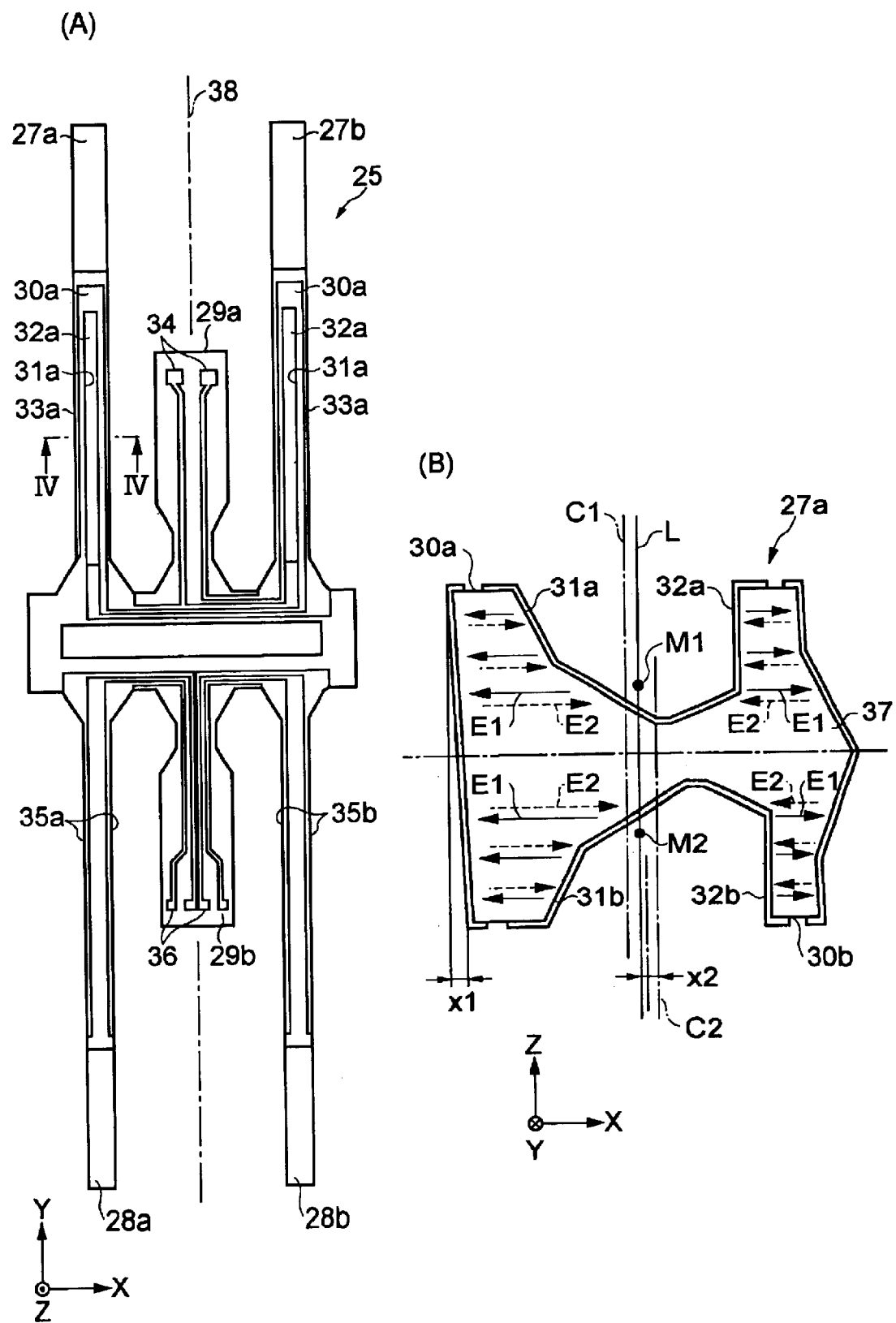
FIG. 7(A) is a plan view of a tuning-fork quartz resonator element for a piezoelectric vibrating gyroscope according to which the second exemplary embodiment of the present invention shown in FIGS. 5(A) and 5(B) is applied.
FIG. 7(B) is a cross-sectional view of a resonating arm, taken along plane VII-VII in FIG. 7(A)

FIGS. 7(A) and 7(B) show a tuning-fork quartz resonator element for a piezoelectric vibrating gyroscope to which the second exemplary embodiment of the present invention is applied. A tuning-fork quartz resonator element 25 basically has a configuration similar to that in the exemplary embodiment shown in FIGS. 4(A)–4(C), and includes a pair of resonating arms 27a and 27b extending from a center base portion 26, and a pair of detecting arms 28a and 28b extending in the opposite direction. Upper and lower principal surfaces 30a and 30b of the resonating arms 27a and 27b are provided with grooves 31a and 31b formed along the lengthwise direction, in a manner similar to that in the tuning-fork quartz resonator element 14 shown in FIGS. 5(A) and 5(B). First electrodes 32a and 32b for driving are provided on side faces and bottom faces of the grooves 31a and 31b, and second electrodes 33a and 33b for driving are provided on side faces of the resonating arms 27a and 27b, thereby forming driving electrodes for vibrating the tuning-fork quartz resonator element 25.

Figure 5:
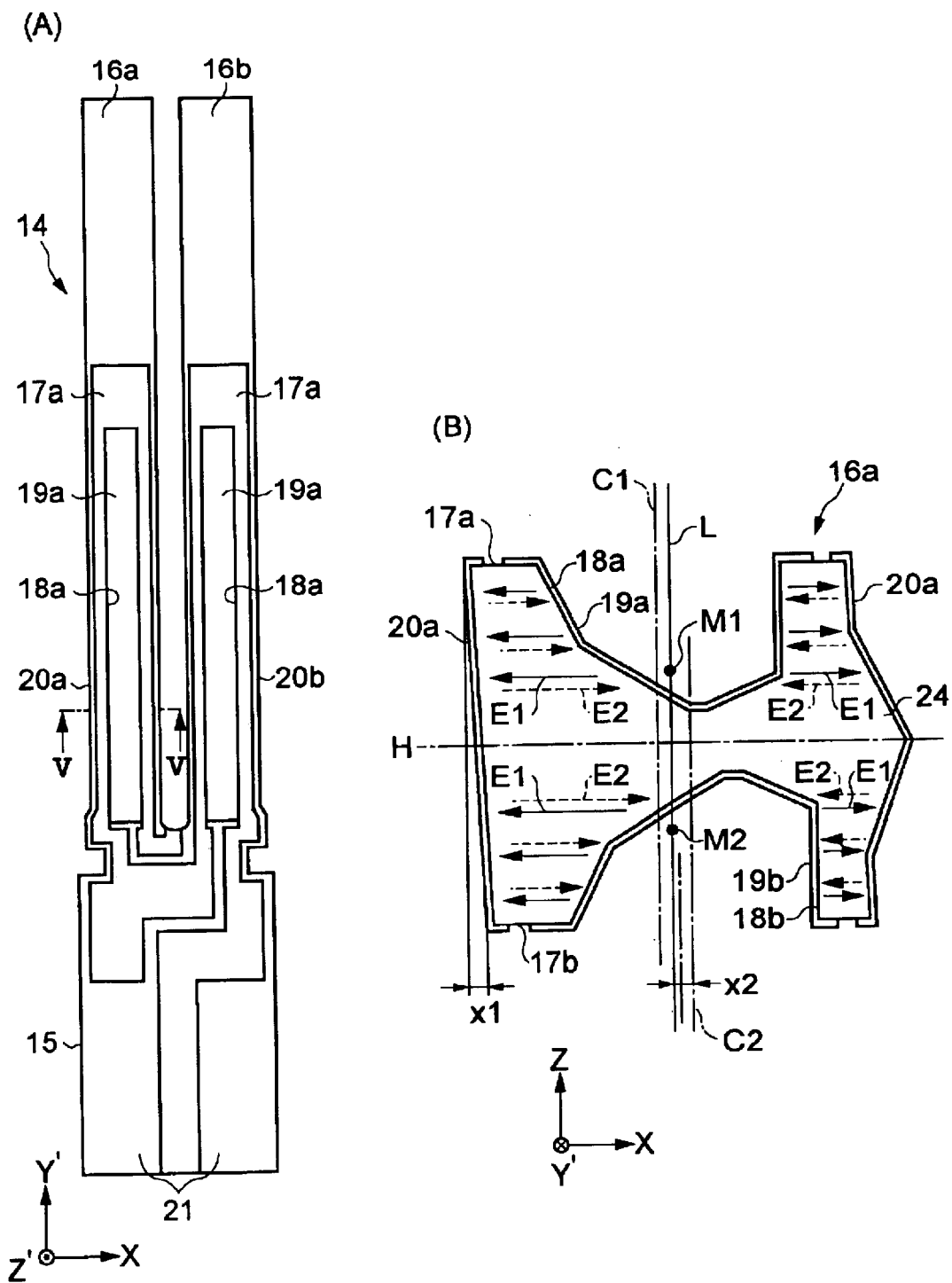
FIG. 5(A) is a plan view of a second exemplary embodiment of a tuning-fork quartz resonator element for use in the quartz resonator shown in FIGS. 1(A) –1(B)
FIG. 5(B) is a cross-sectional view of a resonating arm, taken along plane V-V in FIG. 5(A)
Figure 6:
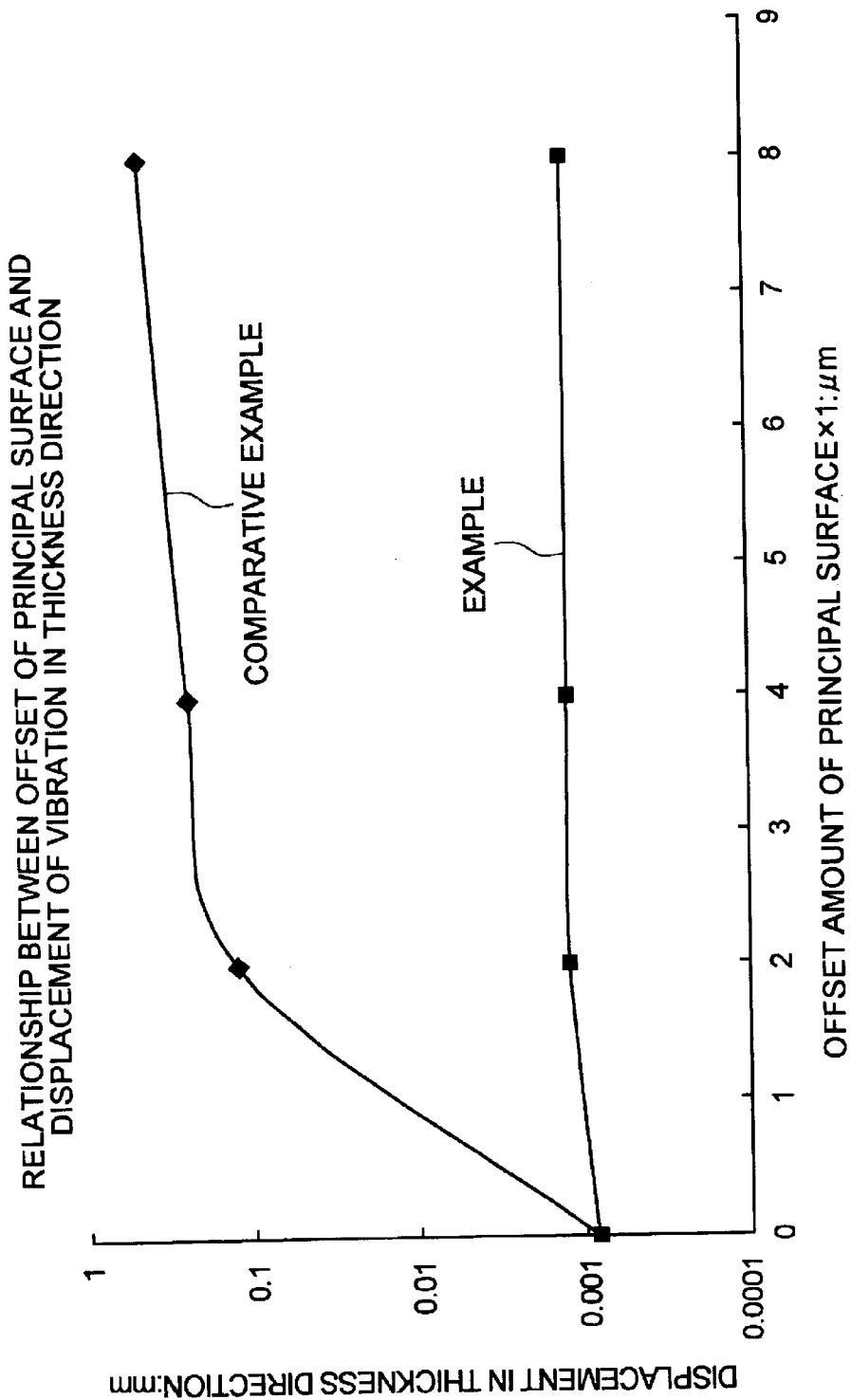
FIG. 6 is a graph comparatively showing changes in natural frequency (oscillation frequency) depending on the amount of offset in the widthwise direction between the upper and lower principal surfaces of the resonating arm in the quartz resonator element shown in FIGS. 5(A) and 5(B) when the positions of the grooves are adjusted according to the present invention and when the positions are not adjusted.

In the tuning-fork quartz resonator element 25, the upper and lower surfaces 30a and 30b of the resonating arms 27a and 27b are offset from each other by x1 in the widthwise direction, that is, in the +X direction, in a manner similar to that in the second embodiment shown in FIG. 5. One of the grooves 31 a is placed so that a center line C1 thereof is aligned with the widthwise center of the corresponding upper principal surface 30a, and the other groove 31b is placed so that a center line C2 thereof is offset by x2 in the +X-direction from the widthwise center of the corresponding lower principal surface 30b. The offset amount x2 of the groove 31b is determined in accordance with the offset amount x1 between the principal surfaces so that the centers of gravity M1 and M2 of an upper portion and a lower portion obtained by dividing the widthwise cross-section of the resonating arm 27a (27b) shown in FIG. 7(B) into two equally in the thickness direction (Z'-direction) along a horizontal line H are aligned with the same line L perpendicular to the principal surfaces.

Even when the principal surfaces of the resonating arms 27a and 27b are offset from each other in the widthwise direction, since a moment due to an unbalance of tensile force and compressive force caused between the upper portion and the lower portion in the thickness direction of the cross-section is cancelled in an entire cross-section by thus aligning the centers of gravity M1 and M2, the displacement in the thickness direction of the resonating arms during excitation can be prevented or reduced. Therefore, in the resonating arms 27a and 27b, loss of strain energy due to vibration leakage is prevented, decreases and variations in the natural frequency, that is, oscillation frequency can be prevented or reduced, and a stable flexural vibration can be ensured.

When a predetermined alternating voltage is applied to the driving electrodes through electrode pads 34 to drive provided in one support portion 29a, electric fields E1 and E2 are alternately produced between the first electrodes 32a and 32b and the second electrodes 33a and 33b adjoining each other, and the resonating arms 26a and 26b exhibit flexural vibration at the resonance frequency, in a manner similar to that in the exemplary embodiment shown in FIGS. 5(A) and 5(B). Since the electric fields E1 and E2 are parallel to the principal surfaces, as shown in FIG. 7(B), field efficiency is substantially enhanced, and the CI value can be reduced.

When the piezoelectric vibrating gyroscope, that is, the tuning-fork quartz resonator element 25 rotates on a Y-axis 38 in FIG. 7(A) in this state, the resonating arms 27a and 27b undergo stress in the Z-axis direction and vibrate in the Z-axis direction because of a Coriolis force that acts in the direction orthogonal to the vibrating direction in accordance with the angular speed of rotation ω. The vibrations vibrate the detecting arms 28a and 28b at their resonance frequency. By detecting the vibrations as electrical signals from the detecting electrode pads 36, the angular speed of rotation, the rotating direction, and the like of the tuning-fork quartz resonator element 25 are found. Since bending of the resonating arms 27a and 27b is not displaced in the thickness direction, as described above, decreases and variations in the natural frequency can be prevented or reduced, and this makes it possible to provide at low cost a higher-precision and higher-reliability piezoelectric vibrating gyroscope that provides stable vibration characteristics.

A desired shape of the tuning-fork quartz resonator element 25 and the grooves 31a and 31b of the resonating arms 27a and 27b are formed by wet-etching a quartz wafer by photolithography to form a quartz element, in a manner similar to that in the tuning-fork quartz resonator element 14. The used quartz wafer is cut from crystal along a plane formed by the X-axis and Y-axis of the crystal. The lengthwise, widthwise, and thickness directions of the resonating arms 27a and 27b are aligned with the Y-axis, X-axis, and Z-axis of the quartz crystal. First, corrosion-resistant films are formed on both surfaces of the quartz wafer, and resist films are formed thereon. By using a pair of upper and lower first photomasks placed thereon, the outline of the quartz resonator element 25 is transferred on the corrosion-resistant films, and the surfaces of the quartz wafer are exposed. The offset in the widthwise direction, that is, in the +X-direction between the upper and lower principal surfaces 30a and 30b of the resonating arms 27a and 27b, and the offset amount x1 are confirmed by the corrosion-resistant films remaining on both the surfaces of the quartz wafer. New resist films are formed on the remaining corrosion-resistant films, the shapes of the grooves 31a and 31b are transferred by using a pair of upper and lower second photomasks placed thereon, and the surfaces of the corrosion-resistant films are exposed. In this case, the second photomasks are positioned so that the center line C1 of one of the grooves 31a is aligned with the widthwise center of the corresponding upper principal surface 30a and so that the center line C2 of the other groove 31b is offset by x2, which is determined by the offset amount x1 between the principal surfaces, in the +X-direction from the widthwise center of the corresponding lower principal surface 30b.

Next, the exposed surfaces of the quartz wafer are etched with an appropriate quartz etchant, such as fluorinated acid, to form the outline of the quartz resonator element 25 including the resonating arms 27a and 27b. Furthermore, the exposed surfaces of the corrosion-resistant films are removed by etchant to expose the surfaces of the quartz wafer. The exposed surfaces of the quartz wafer are similarly half-etched to a predetermined depth with quartz etchant, and the grooves 31a and 31b are formed on the upper and lower principal surfaces 30a and 30b of the resonating arms 27a and 27b.

An electrode material is deposited on all the surfaces of the quartz element thus formed, including the inner faces of the grooves of the resonator element, by evaporation, sputtering, and so on, thereby forming electrode films. Photoresists are applied thereon, and are dried to form resist films. In a state in which a pair of upper and lower third photomasks having an etching pattern corresponding to desired electrodes and wiring patterns are placed thereon, the surfaces of the electrode films are exposed by performing exposure and development. The exposed surfaces of the electrode films are etched to expose the surfaces of the quartz wafer for polarization, thereby forming the electrodes, electrode pads, and wiring patterns connecting the electrodes described above.

While the preferred exemplary embodiments of the present invention have been described in detail above, the present invention can be carried out by adding various changes and modifications to the above exemplary embodiments within the technical scope, as is evident to those skilled in the art. For example, the tuning-fork piezoelectric resonator element of the present invention may use various piezoelectric single-crystal materials, such as lithium niobate, other than quartz crystal. Furthermore, a piezoelectric device, such as a piezoelectric oscillator or a real-time clock, can be formed by mounting ICs that form driving circuits and the like in addition to the tuning-fork quartz resonator element 14 inside a package similar to that in FIGS. 1(A) and 1(B).

In the tuning-fork piezoelectric resonator element of the present invention, when the outline of the tuning-fork piezoelectric resonator element and the grooves of the resonating arms are formed by wet-etching a piezoelectric material having etching anisotropy in a method that has been popularly performed, the groove extending in the lengthwise direction of at least one principal surface of the resonating arm is provided on the principal surface so that the widthwise center line is offset from the center line of the resonating arm in the direction opposite to the direction of etching anisotropy. Since a danger is thereby dismissed that the cross-section will be asymmetrical in the widthwise direction, and that the stiffness of the resonating arm will be unbalanced on the right and left sides of the center line, bending of the right and left sides of the resonating arm is stabilized, loss of strain energy due to vibration leakage is prevented, and stable bending can be ensured. Consequently, high stability can be achieved in addition to enhancement of performance by the reduction of the CI value.

In the tuning-fork piezoelectric resonator element of the present invention, the position of the groove is adjusted so that the centers of gravity of the two upper and lower portions of the widthwise cross-section of the resonating arm divided equally into two in the thickness direction are aligned with the same line perpendicular to the principal surfaces. Since the displacement in the thickness direction during excitation can be thereby overcome or reduced, loss of strain energy due to vibration leakage is prevented, and stable bending can be ensured. Extremely stable resonation characteristics can be achieved in addition to enhancement of performance by the reduction of the CI.

Furthermore, in the production method of the tuning-fork piezoelectric resonator element of the present invention, at least one principal surface of each of the resonating arms of the tuning-fork piezoelectric resonator element, which is externally made of a piezoelectric material having etching anisotropy, is subjected to wet etching, and the groove extending in the lengthwise direction of the resonating arm is formed so that the center line thereof in the widthwise direction is offset from the center line of the resonating arm in the direction opposite to the direction of etching anisotropy. Thereby, the unbalanced stiffness of the grooved resonating arm due to its asymmetrical cross-section is overcome or enhanced, bending of the right and left sides of the resonating arm is stabilized, and loss of strain energy due to vibration leakage is prevented. This makes it possible to produce a tuning-fork piezoelectric resonator element, which can repeat stable bending, at high yield through the related art process, and to reduce production cost.

In the production method of the tuning-fork piezoelectric resonator element of the present invention, by adding a step of adjusting the position of the groove formed on one of the principal surfaces of each resonating arm to the related art process, the displacement in the thickness direction due to the offset in the widthwise direction between the upper and lower principal surfaces of the resonating arm caused when forming the outline of the resonating arm can be overcome or reduced. Therefore, it is possible to produce a tuning-fork piezoelectric resonator element, which prevents loss of strain energy due to vibration leakage and exhibits stable vibration characteristics, at high yield and at low cost.

What is claimed is:

1. A tuning-fork piezoelectric resonator element made of a piezoelectric material having etching anisotropy in a predetermined direction, the tuning-fork piezoelectric resonator element comprising:

a base portion;

a pair of resonating arms extending from the base portion; and driving electrodes including first electrodes provided on front and back principal surfaces of each of the resonating arms, and second electrodes provided on side faces of the resonating arms, at least one of the principal surfaces of each resonating arm being provided with a groove extending in a lengthwise direction of the resonating arm so that a widthwise center line of the groove is offset from a center line of the resonating arm in a direction opposite to the predetermined direction of the etching anisotropy, and the first electrode provided on at least one of the principal surfaces being formed of an electrode film formed on a side face of the groove.

2. The tuning-fork piezoelectric resonator element according to claim 1, the piezoelectric material being quartz crystal.

3. The tuning-fork piezoelectric resonator element according to claim 2, the lengthwise, widthwise, and thickness directions of the resonating arm corresponding to the Y-axis, X-axis, and Z-axis directions, respectively, of the quartz crystal, and the groove being offset from the center line of the resonating arm in the widthwise direction and in the -X-direction of the quartz crystal.

4. The tuning-fork piezoelectric resonator element according to claim 3, the amount of offset of the center line of the groove from the center line of the resonating arm being within the range of 1% to 5% of the width of the resonating arm.

5. The tuning-fork piezoelectric resonator element according to claim 4, the amount of offset of the center line of the groove from the center line of the resonating arm being within the range of 2% to 4% of the width of the resonating arm.

6. The tuning-fork piezoelectric resonator element according to claim 1, further comprising:

another pair of resonating arms extending from the base portion in a direction opposite to the pair of resonating arms.

7. A piezoelectric device, comprising:

the tuning-fork piezoelectric resonator element according to claim 1; and a package in which the tuning-fork piezoelectric resonator element is fixed at the base portion and is sealed.

8. The piezoelectric device according to claim 7, further comprising:

an integrated circuit element mounted in the package.

9. A tuning-fork piezoelectric resonator element, comprising:

a base portion;

a pair of resonating arms extending from the base portion;

grooves extending on upper and lower principal surfaces of each of the resonating arms in a lengthwise direction; and a driving electrode including a first electrode provided on a side face of each of the grooves and a second electrode provided on a side face of each of the resonating arms;

one of the grooves is being offset from the other groove in the widthwise direction of the resonating arm in the same direction as the direction in which the principal surface having the one of the grooves is offset from the principal surface having the other groove, and centers of gravity of two upper and lower portions of the widthwise cross-section of the resonating arm divided into two equally in the thickness direction being aligned with the same line perpendicular to the principal surfaces.

10. The tuning-fork piezoelectric resonator element according to claim 9, the tuning-fork piezoelectric resonator element being made of quartz crystal.

11. The tuning-fork piezoelectric resonator element according to claim 10, the lengthwise, widthwise, and thickness directions of the resonating arm being oriented corresponding to the Y-axis, X-axis, and Z-axis directions of the quartz crystal.

12. A production method of a tuning-fork piezoelectric resonator element, the method comprising:

processing a wafer made of a piezoelectric material having etching anisotropy in a predetermined direction to form an outline of a tuning-fork piezoelectric resonator element including a base portion and a pair of resonating arms extending from the base portion;

wet-etching at least one of front and back principal surfaces of each of the resonating arms to form a groove extending in a lengthwise direction of the resonating arm so that a center line of the groove is offset in a widthwise direction from a center line of the resonating arm in a direction opposite to the predetermined direction of the etching anisotropy; and forming a driving electrode by forming and patterning an electrode film on the principal surfaces and side faces of the resonating arm and on an inner face of the groove.

13. The production method of a tuning-fork piezoelectric resonator element according to claim 12, the piezoelectric material being quartz crystal.

14. The production method of a tuning-fork piezoelectric resonator element according to claim 13, the lengthwise, widthwise, and thickness directions of the resonating arm being oriented corresponding to the Y-axis, X-axis, and Z-axis directions, respectively, of the quartz crystal, and the groove being offset from the center line of the resonating arm in the widthwise direction and in the -X-direction of the quartz crystal.

15. The production method of a tuning-fork piezoelectric resonator element according to claim 14, the amount of offset of the center line of the groove from the center line of the resonating arm being set within the range of 1% to 5% of the width of the resonating arm.

16. The production method of a tuning-fork piezoelectric resonator element according to claim 15, the amount of offset of the center line of the groove from the center line of the resonating arm being set within the range of 2% to 4% of the width of the resonating arm.

17. The production method of a tuning-fork piezoelectric resonator element according to claim 12, the processing of an outline being performed so that the tuning-fork piezoelectric resonator element further includes another pair of resonating arms extending from the base portion in a direction opposite to the pair of resonating arms.

18. A production method of a tuning-fork piezoelectric resonator element, the method comprising:

processing a wafer made of a piezoelectric material to form an outline of a tuning-fork piezoelectric resonator element including a base portion and a pair of resonating arms extending from the base portion;

forming, on upper and lower principal surfaces of each of the resonating arms, grooves extending in the lengthwise direction of the resonating arm by photoetching; and forming and patterning an electrode film on the principal surfaces and side faces of the resonator element and on inner faces of the grooves;

corresponding to the offset of one of the principal surfaces from the other principal surface in the widthwise direction of the resonating arm caused in the processing of forming the outline of the resonator element, one of the grooves formed on the one principal surface being offset from the other groove formed on the other principal surface in the same direction as the direction of the offset between the principal surfaces during the forming of the grooves by photoetching; and centers of gravity of upper and lower portions of the widthwise cross section of the resonating arm divided into two equally in the thickness direction being aligned on the same line perpendicular to the principal surfaces.

19. The production method of a tuning-fork piezoelectric resonator element according to claim 18, the piezoelectric material being quartz crystal.

20. The production method of a tuning-fork piezoelectric resonator element according to claim 19, the lengthwise, widthwise, and thickness directions of the resonating arms being oriented corresponding to the Y-axis, X-axis, and Z-axis direction of the quartz crystal.

21. The production method of a tuning-fork piezoelectric resonator element according to claim 18, the one groove being aligned with the widthwise center of the principal surface on which the one groove is formed, and the other groove being positioned in conjunction with the one groove during the forming the grooves by photoetching.

* * * * *